(12) United States Patent
Simmons

(10) Patent No.: US 9,012,774 B2
(45) Date of Patent: Apr. 21, 2015

(54) SEALING MEMBER FOR AN ENCLOSURE

(75) Inventor: Richard L. Simmons, Leander, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 243 days.

(21) Appl. No.: 13/696,457

(22) PCT Filed: Jun. 2, 2011

(86) PCT No.: PCT/US2011/038898
§ 371 (c)(1),
(2), (4) Date: Nov. 6, 2012

(87) PCT Pub. No.: WO2011/162926
PCT Pub. Date: Dec. 29, 2011

(65) Prior Publication Data
US 2013/0081849 A1 Apr. 4, 2013

Related U.S. Application Data

(60) Provisional application No. 61/356,841, filed on Jun. 21, 2010.

(51) Int. Cl.
*H05K 5/06* (2006.01)
*H01R 9/22* (2006.01)
*H01R 13/52* (2006.01)

(52) U.S. Cl.
CPC ............... *H05K 5/061* (2013.01); *H01R 9/223* (2013.01); *H01R 13/5202* (2013.01)

(58) Field of Classification Search
USPC .................................................. 174/50.5, 93
See application file for complete search history.

(56) References Cited

U.S. PATENT DOCUMENTS

| 5,525,073 | A | | 6/1996 | Sampson | |
|---|---|---|---|---|---|
| 5,561,269 | A | | 10/1996 | Robertson | |
| 5,696,351 | A | * | 12/1997 | Benn et al. | 174/92 |
| 5,802,715 | A | | 9/1998 | O'Neill | |
| 6,218,620 | B1 | * | 4/2001 | Michel | 174/92 |
| 6,333,463 | B1 | * | 12/2001 | Bukovnik et al. | 174/77 R |
| 6,881,901 | B2 | * | 4/2005 | Egan | 174/665 |
| 7,141,738 | B2 | * | 11/2006 | Marsac et al. | 174/92 |
| 2004/0238201 | A1 | | 12/2004 | Asakura | |

(Continued)

FOREIGN PATENT DOCUMENTS

| EP | 0 189 240 A1 | 7/1986 |
|---|---|---|
| FR | 2 723 162 B1 | 10/1996 |
| FR | 2 770 048 B1 | 12/1999 |

(Continued)

*Primary Examiner* — Timothy Thompson
*Assistant Examiner* — Charles Pizzuto
(74) *Attorney, Agent, or Firm* — Janet A. Kling

(57) ABSTRACT

Disclosed is an exemplary a re-enterable enclosure for a cable splice. The enclosure includes a cover and a base configured for engagement with the cover, wherein the cover and the base form a cavity for enclosing the cable splice when the base and cover are in a closed position. The enclosure also includes first and second sealing members disposed in the base and the cover. The first sealing member has first and second end portions coupled by a longitudinal member, wherein each end portion includes at least two lobes separated by a gap. The second sealing member includes a third end portion having a protrusion, wherein the protrusion on the third end portion is configured for insertion into the gap between the lobes of one of the first and second end portions of the first sealing member to form an intermating seal.

8 Claims, 14 Drawing Sheets

(56) References Cited

U.S. PATENT DOCUMENTS

2008/0169116 A1     7/2008   Mullaney
2010/0240274 A1*   9/2010   Paterson et al. ................. 445/44

FOREIGN PATENT DOCUMENTS

| JP | 11-041781 A | 2/1999 |
| JP | 11-204982 A | 7/1999 |
| JP | 2002-056906 A | 2/2002 |
| WO | 00-67354 | 11/2000 |

\* cited by examiner

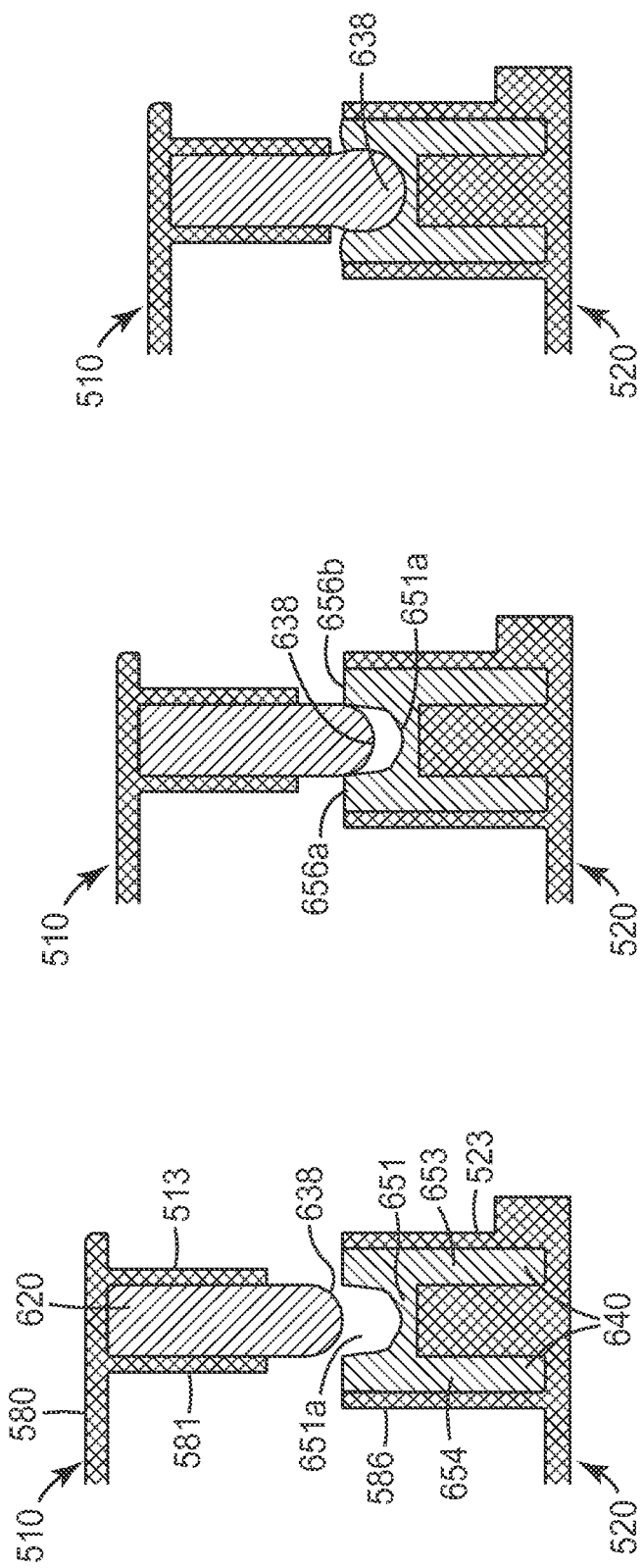

SEALING MEMBER FOR AN ENCLOSURE

The present invention relates to an enclosure to protect a splice or connection between cables. In particular, the present invention relates to an enclosure having intermating sealing members to ensure a reliable environmental seal.

BACKGROUND

Telecommunication cables are ubiquitous and used for distributing all manner of data across vast networks. As telecommunication cables are routed across data networks, it is necessary to periodically open the cable so that it can be connected to a second cable or to an earth ground, for example.

At each point where a telecommunication cable is opened, it is necessary to provide some type of enclosure to protect the exposed interior of the cable. Commonly, the enclosure has one or more ports through which cables enter and/or exit the enclosure. Once inside the enclosure, connections between communication cables are made.

Typical enclosures for the telecommunications market provide mechanical and/or environmental protection for connections between at least two cables. The cable can, for example, be a telecommunications cable, a power cable, an optical fiber cable, coaxial cable, or any other type of cable. The connection can be made via a conventional splice or a connector. A connection point between the cables generally requires protection from the effects of the environment in which it is located and, more particularly, requires protection against mechanical impact and the entry of moisture.

Many different enclosures providing different levels of protection for cable splices are commercially available, including so-called re-enterable enclosures that can be re-opened to permit access to the splice whenever required. Many conventional telecommunication enclosures often employed to protect a plurality of twisted pair copper splices and/or fiber optic connections in the outside plant telecommunications market. These closures can be relatively large and bulky and are not well suited to applications requiring a single closure to protect a single connection point between two communication cables, especially when the connection is one of many densely placed or ganged connections such as one might find in cell tower installations. Thus, a need exists for a smaller, more craft friendly enclosure which will fit in tight spaces and which has improved workability in the field.

SUMMARY

The present invention is directed to an enclosure for a cable splice. The enclosure includes a cover and a base configured for engagement with the cover, wherein the cover and the base form a cavity for enclosing the cable splice when the base and cover are in a closed position. Additionally, the enclosure can have a first sealing member disposed in one of the base and the cover and at least one second sealing member disposed in the other of the cover and the base. The first sealing member has first and second end portions coupled by a longitudinal member, wherein each end portion includes at least two lobes separated by a gap. The at least one second sealing member has a third end portion having a protrusion, wherein the protrusion on the third end portion is configured for insertion into the gap between the lobes of one of the first and second end portions of the first sealing member to form an intermating seal.

The enclosure can further include a plurality of stops disposed at each end of the base and the cover. The stops can be configured to engage with portions of the first and second sealing members to enhance compression of the sealing members in the intermating seal.

BRIEF DESCRIPTION OF THE DRAWINGS

The present invention will be further described with reference to the accompanying drawings wherein like reference numerals refer to like parts in the several views, and wherein:

FIGS. 10A-10C are three cross-sectional schematic views showing the compression of the sealing gasket structures during latching of the exemplary enclosure of FIG. 9A.

Figure 1A:
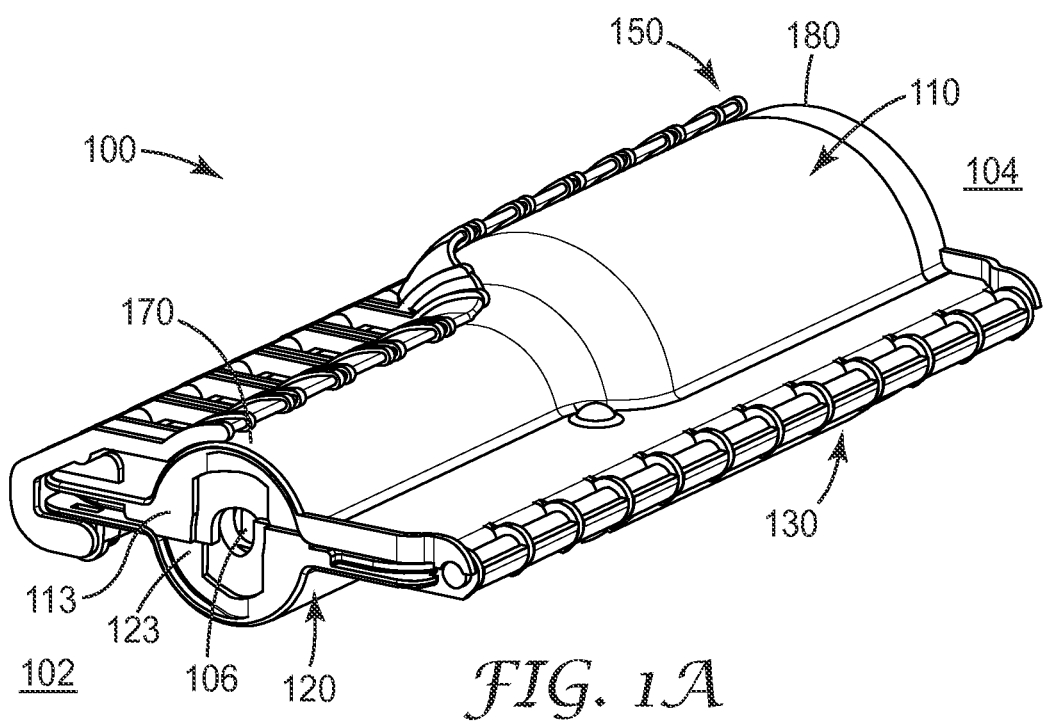
FIGS. 1A and 1B are two isometric views of an exemplary enclosure according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The splice enclosure 100 as described herein is of simple construction, and uses comparatively few components to enable easy assembly in the field, even at difficult or inaccessible locations.

Figure 8A:
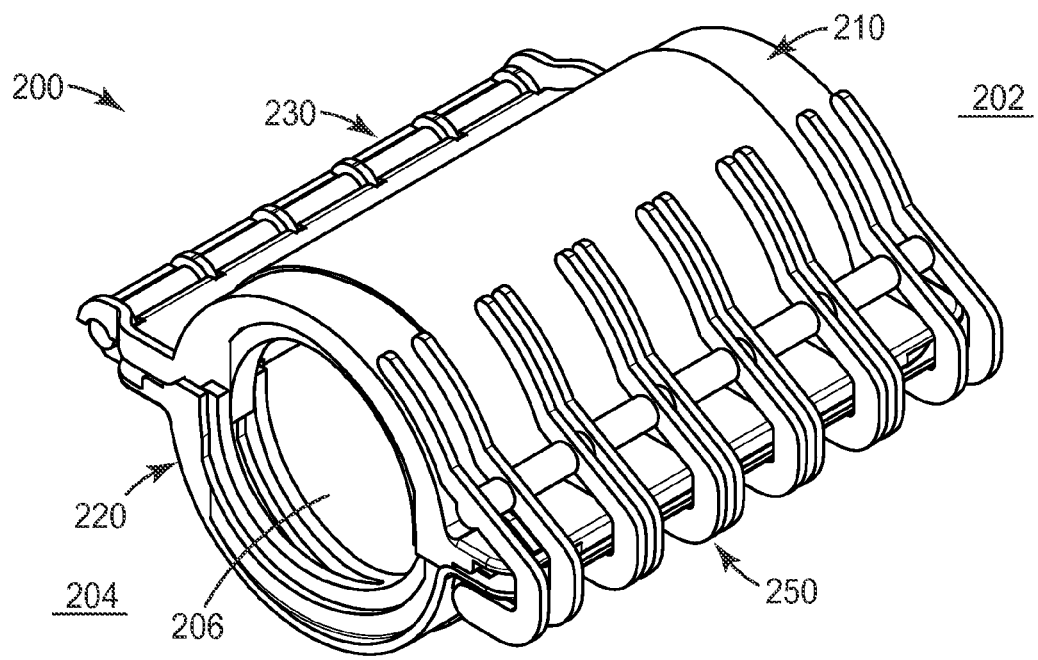
FIG. 8A is an alternative exemplary enclosure according to an embodiment of the present invention.
Figure 8B:
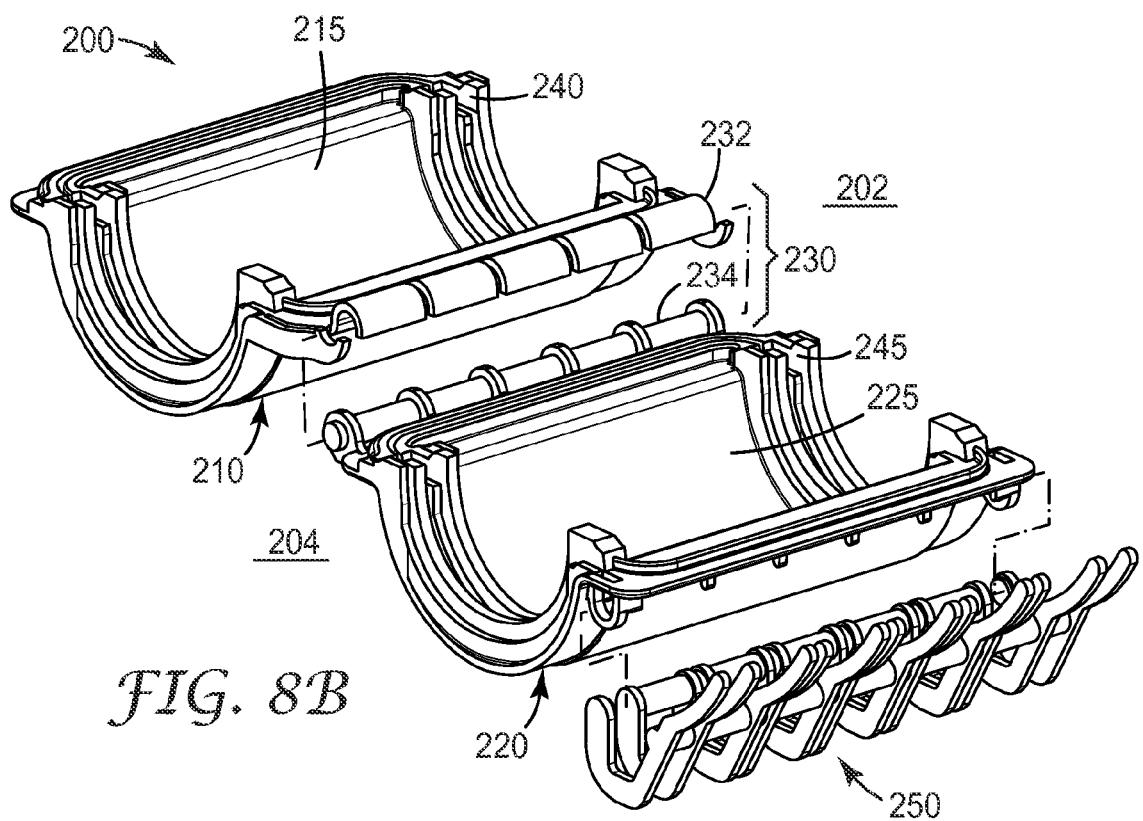
FIG. 8B is an exploded isometric view of the enclosure of FIG. 8A.

Referring to FIGS. 1A-1B, 2 and 3, one embodiment of an enclosure 100 for protecting a cable splice is illustrated in an assembled and exploded condition, respectively. Splice enclosure 100 includes a cover 110 and a base 120 having a first end 102 and a second end 104. The cover and the base 110, 120 are configured for engagement with each other and used, in a manner to be described below, to form a protective re-enterable enclosure for one or more cable splices. In the illustrated implementation, base and cover 120, 110 form a longitudinal or elongated enclosure having a generally fluted shape as shown in FIGS. 1A-1B, 2 and 3 or a generally cylindrical shape as shown in FIGS. 8A and 8B. In other implementations, base and cover 120, 110 may assume other shapes or configurations as are required for a particular application.

The fluted shape of the enclosure of FIG. 1A is especially useful when the cables to be joined have significantly different diameters. For instance, coaxial cables are used to transmit radio frequency signals from the amplifiers at the base of cell phone towers to the antennae on the top of the tower. The current practice is to install coaxial cable of up to about 2" diameter for most of the distance between amplifiers and antennae. The large diameter provides better signal to noise than smaller diameter cables, but it is not sufficiently flexible to make it convenient to connect to the amplifiers and antennae. A smaller diameter 'flex' cable with better flexibility but higher loss is used at the top of the towers for the final connection to the antennae.

Today, the connector used to connect these two dissimilar diameter cables is often protected by wrapping with three layers of different tapes. Removing these tapes to check and renew the connection is cumbersome and difficult, particularly given the often small separation between cables where the connections are made. In addition, these closely packed gangs of connections are often located near the top of the cell tower where it can be cumbersome to use tape to wrap the connections.

A compact, easy to install enclosure, such as is described herein, can enhance the installation and maintenance of these connections.

In the embodiment of 1A-1B, 2 and 3, base 120 and cover 110 are separately formed members and are movably joined to each other at a hinge 130 and secured in a closed position by latch 150. To form hinge 130, the base and the cover include hinge portions 134, 132, respectively, at first longitudinal side edges 111, 121 thereof. Hinge portions 134, 132 of the base and the cover are configured for rotatable engagement with each other, and thereby rotatably join the base and the cover. Hinge portion 134 on cover 120 can include generally cylindrical hinge portions 135 that engage mating clips 133 to facilitate the rotation of the cover with respect to the base about hinge 130. In one embodiment, hinge portions 134, 132 are configured for snap fit engagement, and may optionally be disengaged by the application of moderate hand force. In another embodiment, the base 120 and the cover 110 are integrally molded with each other and joined at a region of reduced thickness that defines hinge 130. This latter type of hinge is well known and is often referred to as a "living" hinge.

In one embodiment, splice enclosure 100 and the components thereof (i.e., cover 110, base 120, and latch 150) are formed from a suitable plastic material, for example polypropylene or polyamide. Cover 110, base 120, and latch 150 may be formed from the same material, or from different materials, depending upon the desired or required material properties. Cover 110, base 120, and latch 150 may be formed using any suitable manufacturing technique, such as injection molding or blow molding.

Base and cover 120, 110 each have a cavity portion 115, 125 respectively. When base and cover 120, 110 are folded together about hinge 130 from an open position (FIG. 2) and are brought into engagement with each other to close the splice enclosure 100, cavity portions 115, 125 together form a central cavity 105 (FIG. 1B) for containing the cable connection that is to be protected. In one embodiment, the cables forming the splice enter central cavity 105 from the first and second ends 102, 104 of enclosure 100.

Two cables can enter enclosure 100 through cable entries 106, 107 in the outer end walls 113, 123 of the cover 110 and the base 120, respectively, at the first end 102 of the enclosure and in the outer end walls 114, 124 of the cover and the base, respectively at the second end 104 of the enclosure. Cable entry 106 through first end region 170 in the first end of the enclosure can be configured to accommodate a smaller diameter cable than cable entry 107 in second end region 180 at the second end of the enclosure. In the exemplary enclosure shown in FIGS. 1A and 1B, the fluted shape of the enclosure body, comprising the cover and the base, closely fits the outer shape of the cables and the connector joining the cables, which will be protected therein, in order to optimize the size of the enclosure so that it can be used in applications having several closely packed connections.

Alternatively, the enclosure can be designed with a substantially cylindrical shape, such as enclosure 200 shown in FIG. 8A, to accommodate the connection of similarly sized cables or cables having dissimilar sizes. However, when enclosure 200 is used to connect cables having dissimilar sizes, the volume and hence the size of the enclosure may be larger than the fluted enclosure 100 of FIG. 1. However, the cylindrical geometry may be preferred when joining cables of a similar size.

Figure 3:
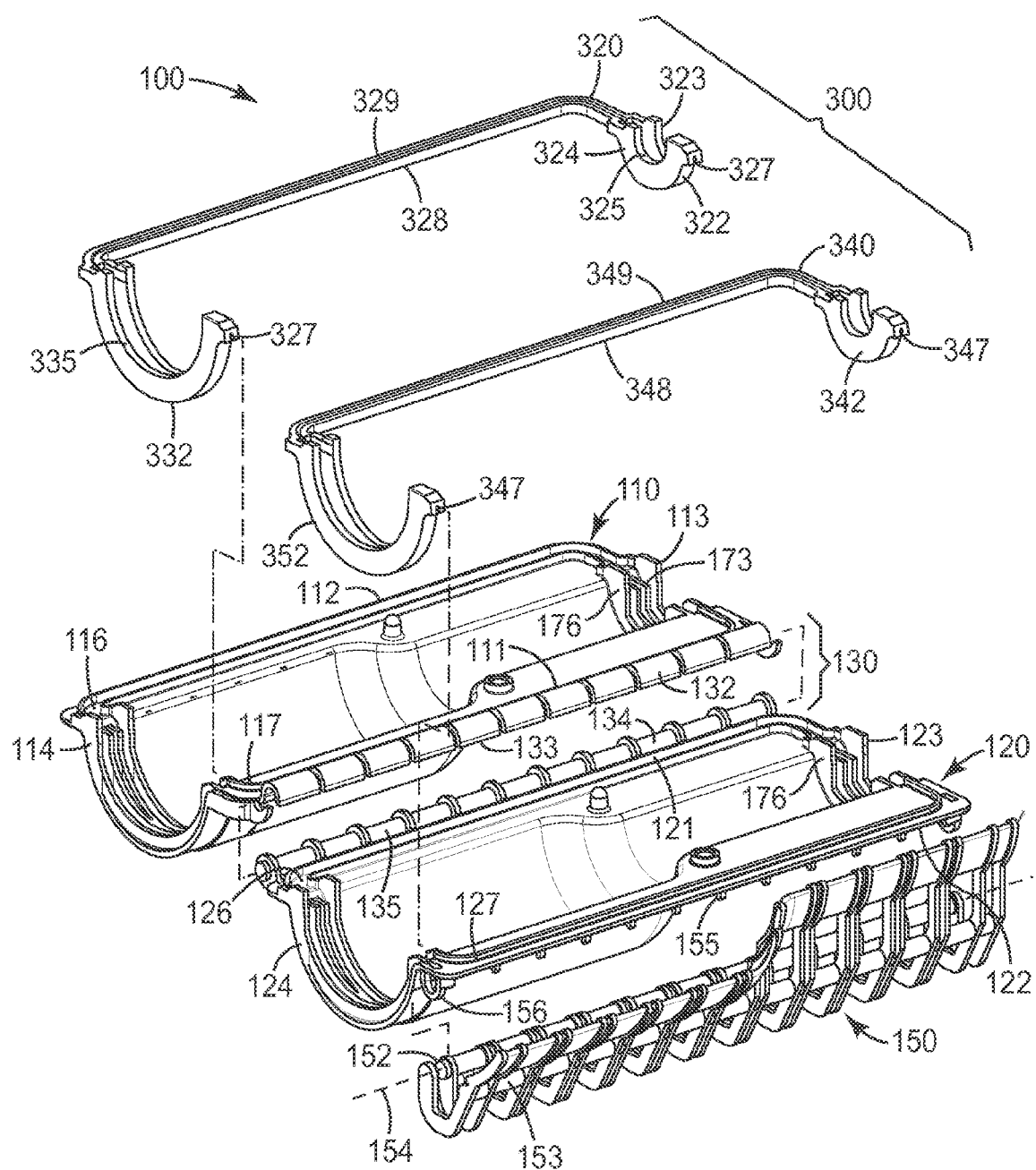
FIG. 3 is an exploded isometric view of an exemplary enclosure according to an embodiment of the present invention.

Enclosure 100 further includes a sealing system 300 to ensure a protective seal along the open edges of the enclosure between the cover and the base and between the outer end walls of the enclosure and the cables passing therethrough. The sealing system, shown in FIGS. 3 and 5A, includes two hermaphroditic sealing members 320, 340 disposed in the cover and the base respectively, as shown in FIG. 3. The hermaphroditic sealing members have the same general shape and are configured to intermate when the enclosure is in a closed and secured state. The hermaphroditic design of the first and second sealing members can provide a manufacturing advantage because fewer molds need to be cut in order to manufacture the sealing members and assembly will be simplified because there are fewer different parts to put together.

Each sealing member can be positioned in a sealing groove 116, 126 (FIGS. 3 and 4C) disposed around a portion of the perimeter of the cover and the base. In order to ensure a tight sealing fit of the sealing system around the cylindrical body of the cable, the first and second sealing members include interlocking or overlapping features which will be described in more detail below.

Figure 5A:
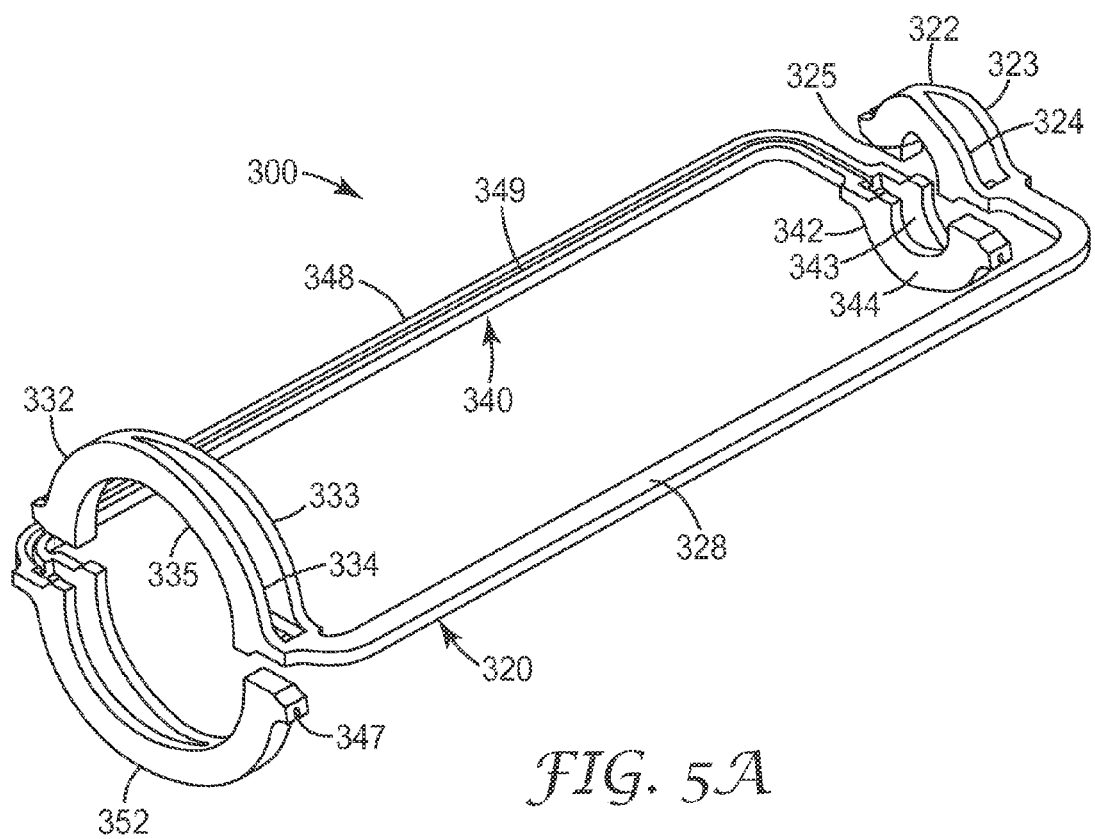
FIG. 5A is an isometric view of an exemplary sealing system for use in an enclosure according to an embodiment of the present invention.

Referring to FIGS. 3 and 5A, the first sealing member 320 has first and second end portions 322, 332 coupled by longitudinal member 328. Similarly, second sealing member 340 has third and fourth end portions 342, 352 linked together by longitudinal member 348. When the sealing members 320, 340 are disposed within the enclosure, the end portions 322, 332, 342, 352 are placed adjacent to outer end walls 113, 114, 123, 124 in the base 120 and cover 110, respectively. Similarly, longitudinal members 328, 348 are placed in sealing grooves 116, 126 disposed substantially parallel to the second longitudinal edge 112 of the cover between outer end walls 113, 114 and the first longitudinal edge 121 of the base between outer end walls 123, 124.

Each end portion has at least two lobes separated by a gap on at least one side thereof. Thus, the first end portion 322 has a first lobe 323 and a second lobe 324. The first and second lobes of the first end portion are connected to one another on one side of the first end portion and connected at two different points to longitudinal member 328. Similarly, the second end portion 332 includes third lobe 333 and fourth lobe 334. The third and forth lobes of the second end portion are connected to one another on one side of the first end portion and connected at two different points to longitudinal member 328. Thus, end portions 322, 342 have a split wedge shape having a gap separating the edges of the end portions where they connect to longitudinal member 328. Additionally, each end portion 322, 342 has a curved surface 325, 335 sized to seal against the cables to be joined within enclosure 100.

Figure 5B:
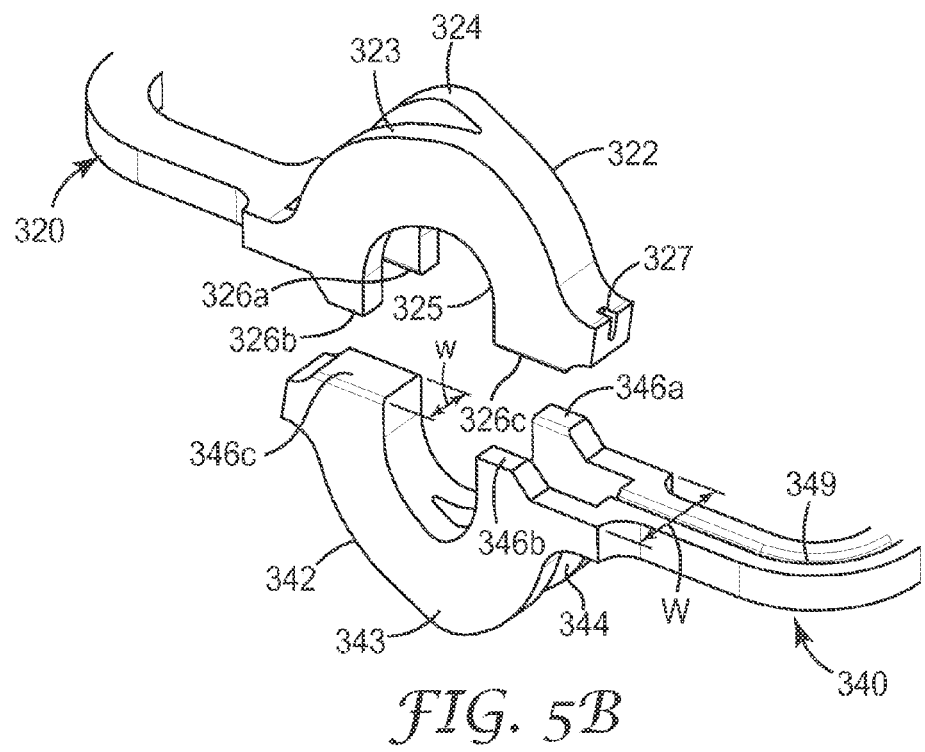
FIG. 5B is an isometric detail view of a portion of exemplary sealing system of FIG. 5A.

The first and second sealing members 320, 340 have interlocking or overlapping features when joined together to ensure a tight sealing fit of the sealing system around the cylindrical body of the cable passing into the enclosure. Referring to FIG. 5B, first end portion 322 can have a plurality of protrusions 326a-326c extending from the lobes 323, 324 of the first end portion configured to extend beyond the theoretical center plane of the cable when the enclosure is closed and latched to improve the sealing capability of the sealing system.

Referring again to FIG. 3, base 120 and cover 110 of enclosure 100 can be sealed continuously around the perimeter of the enclosure including along the longitudinal edges of the enclosure. In order to seal along the longitudinal edges of the enclosure, the base and cover can each have a side sealing blade 117, 127 disposed along the longitudinal edge opposite the sealing grooves 116, 126. The side sealing blades 117, 127 engage channels 349, 329 in the second and first sealing members 340, 320. Thus, side sealing blade 117 on cover 110 engages with channel 349 in the second sealing member 340 disposed in sealing groove 126 in base 120 and side sealing blade 127 on the base engages with channel 329 in the first sealing member 320 disposed in sealing groove 116 in cover 110 when the enclosure is closed and latched to ensure the sealing of the enclosure along its longitudinal edges.

The sealing members 320, 340 can also include an engagement notch 327, 347 on the free end of each end portion 322, 332, 342, 352 of each sealing members 320, 340. The engagement notches 327, 347 engage with the sealing blades 117, 127 on the cover 110 or base 120 in which the sealing member is disposed.

The sealing members 320, 340 can be formed from, for example, elastomeric and polymeric materials, such as thermoplastic elastomers, vulcanite rubbers, polyurethane foams, closed cell silicone foam rubbers, reactive and non-reactive polymers, and soft plastics, to name a few. Material selection will depend upon factors including, but not limited to, material durometer, chemical and environmental exposure conditions including temperature and humidity conditions, and flame-retardancy requirements. In one embodiment, the material of the sealing members is an elastomeric material that is substantially incompressible, but that deforms sufficiently to allow the cable passages to form a resilient seal.

Figure 5C:
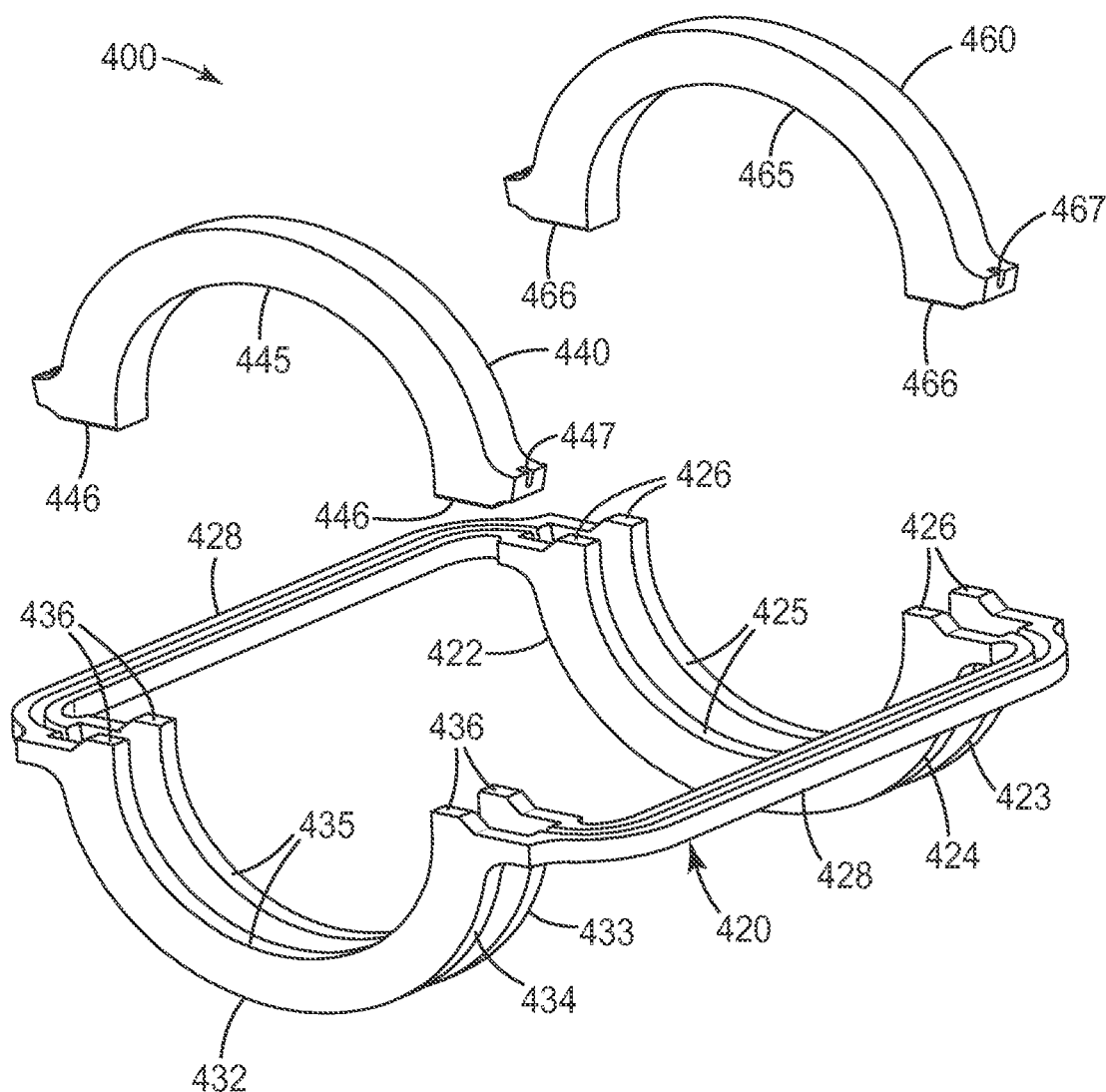
FIG. 5C is an isometric view of an alternative exemplary sealing system for use in an enclosure according to an embodiment of the present invention.

FIG. 5C shows an alternative exemplary a sealing system 400 that is useable with another exemplary enclosure to ensure a protective seal along the open edges of the enclosure between the cover and the base and between the outer end walls of the enclosure and the cables passing therethrough. Sealing system 400 includes three sealing members 420, 440 and 460. Sealing member 420 can be placed in sealing grooves disposed parallel to the longitudinal edges of one of the base and the cover. The second and third sealing members 440, 460 are disposed adjacent the outer end walls of the other of the cover or base which does not have the first sealing member. In order to ensure a tight sealing fit of the sealing system around the cylindrical body of the cable, the second and third sealing members include interlocking or overlapping features which intermate with the interlocking or overlapping features of the first sealing member as described in more detail below.

Referring to FIG. 5C, the first sealing member 420 has first and second end portions 422, 432 linked together by two longitudinal members 428. When the sealing member 420 is disposed within one of the base or the cover of the enclosure, the end portions 422, 432 are placed adjacent to outer end walls in the base or cover of the enclosure. Similarly, longitudinal members 428 can be disposed in sealing grooves along the longitudinal edges of the base or cover between outer end walls at either end of the enclosure.

Each end portion 422, 432 has at least two lobes separated by a gap therebetween. Thus, the first end portion 422 has a first lobe 423 and a second lobe 424. The first and second lobes of the first end portion are connected on either end to two different points on longitudinal members 428. Similarly, the second end portion 432 includes third lobe 433 and fourth lobe 434. The third and forth lobes of the second end portion are connected on either end to two different points on longitudinal members 428. Thus, end portions can have a gap separating the end portions. Additionally, each end portion 422, 442 has a curved surface 425, 435 sized to seal against the cables to be joined within enclosure including the first sealing member.

The second and third sealing members 440, 460 are configured as an end portion of sealing system 400. Sealing members 440, 460 are configured to fit in an enclosure adjacent the outer end walls of the cover or the base. Interlocking or overlapping features on sealing members 440, 460 are configured to fit between the lobes of the first sealing member 420 to ensure a reliable protective seal when the enclosure is in a closed and latched configuration. Additionally, second and third sealing members 440, 460 have curved surfaces 445, 465 sized to seal against the cables to be joined within enclosure including the first sealing member.

The second and third sealing members 440, 460 have interlocking features or protrusions 446, 466 that when joined together with interlocking features or protrusions 426, 436 on the first and second end portions 422, 432 of the first sealing member 420 to ensure a tight sealing fit of the sealing system around the cylindrical body of the cable passing into the enclosure. Each of the interlocking features or protrusions 426, 436, 446, 466 can be configured to extend beyond the theoretical center plane of the cable when the enclosure is closed and latched to improve the sealing capability of the sealing system.

Additionally, the second and third members 440, 460 can also include an engagement notch 447, 467 on each side of the sealing member. The engagement notches 447, 467 engages with the sealing blades on the cover or base in which the sealing member is disposed to ensure proper alignments of the sealing members in the enclosure.

The end portions of the sealing members are disposed in an end region 170, 180 at the first and second ends 102, 104 of enclosure 100 adjacent to outer end walls 113,123, 114, 124. FIG. 4C illustrates an enlarged view of the first end region 170 of enclosure 100 in an open state to show the sealing member retaining features on the cover and the base of the enclosure. The first end region is bounded by outer end walls 113,123 and inner end walls 171,176 in the cover 110 and base 120, respectively. The first outer end wall 113 on the cover has a first section 113a which can be oriented substantially perpendicular to the longitudinal edges of the enclosure and disposed at the first end of the enclosure and a second section 113b which can also be oriented substantially perpendicular to the longitudinal edges of the enclosure but which is offset from the first end of the enclosure. The first and second sections of the outer wall are connected by a transition section 113c. The first inner wall 171 on the cover is spaced apart from the first outer wall and can be the mirror image of the first outer wall. Thus, the first inner and outer walls are separated by a first separation distance, D, between the first sections 113a, 171a of the inner and outer end walls and a second separation distance, d, between the second sections 113b, 171b of the inner and outer end walls. The separation distances D, d are slightly larger than the widths W, w of the corresponding sections of the sealing member end portions (FIG. 5B) such that the end portions of the sealing members may be snugly disposed between the inner and outer end walls.

Alternatively sealing systems 300, 400 can be configured to provide a sealing fit around cables having other cross sectional shapes such as an elliptical, rectangular, figure-8 or other polygonal shaped cross-section.

The end region can additionally have a central partition 172, 177 disposed between the end walls configured to support the inner surfaces of the lobes of the sealing member end portions. In an exemplary, aspect the central partition can have a wishbone shape as shown in FIG. 4C which is configured for use with sealing members shown in FIG. 5A. In an alternative aspect, the central partition may be in the form of a single partition wall or can have a rectangular shape when it is configured for use with the first sealing member 420 shown in FIG. 5C.

The end region 170 will additionally have a plurality of stops 113d, 171d, 178, 173 disposed on the top surfaces of the inner and outer end walls and the central partition, respectively. The stops interact with the interlocking features or protrusions 326a-c, 346a-c (FIG. 5B) on the first and second sealing members 320, 340 to enhance the sealing of the enclosure. This interaction will be described in additional detail below.

Figure 1B:
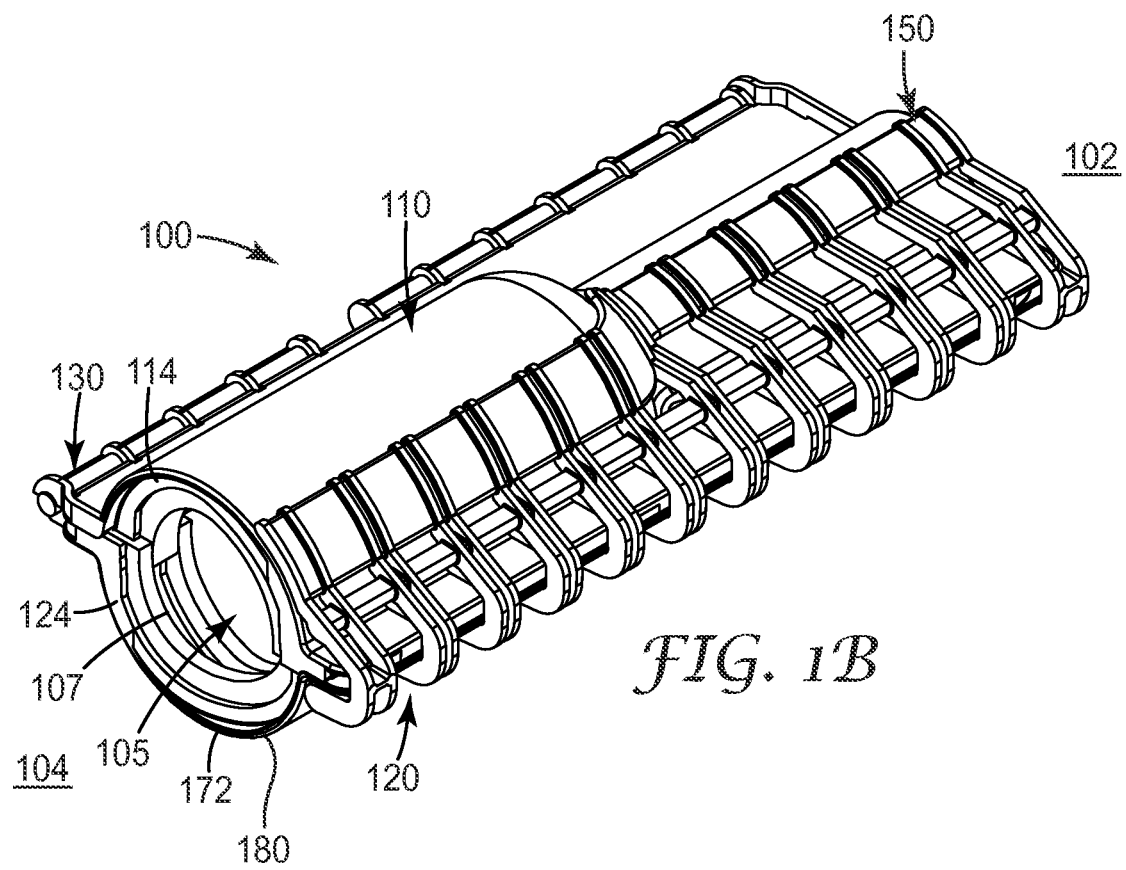
Figure 2:
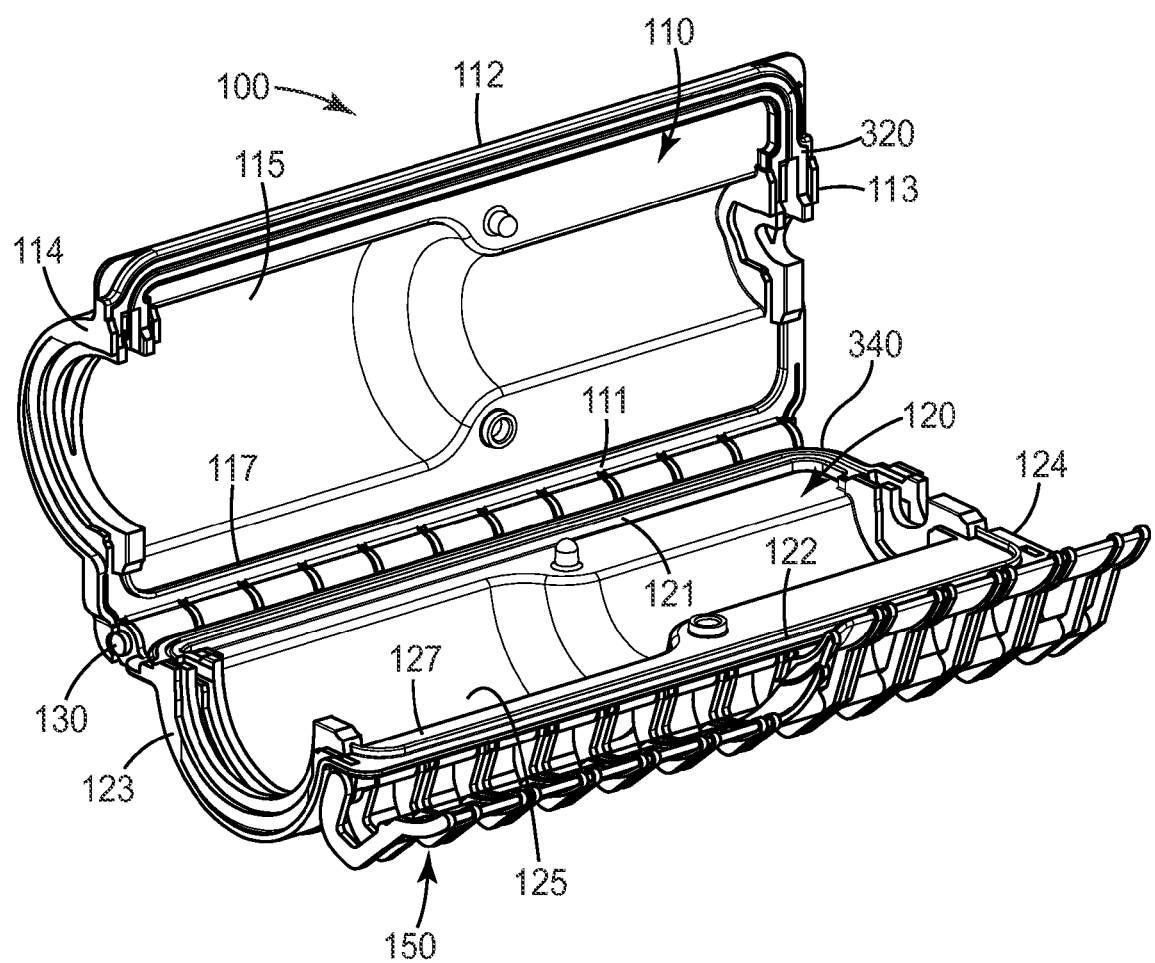
FIG. 2 is another isometric view of an exemplary enclosure according to an embodiment of the present invention.
Figure 4A:
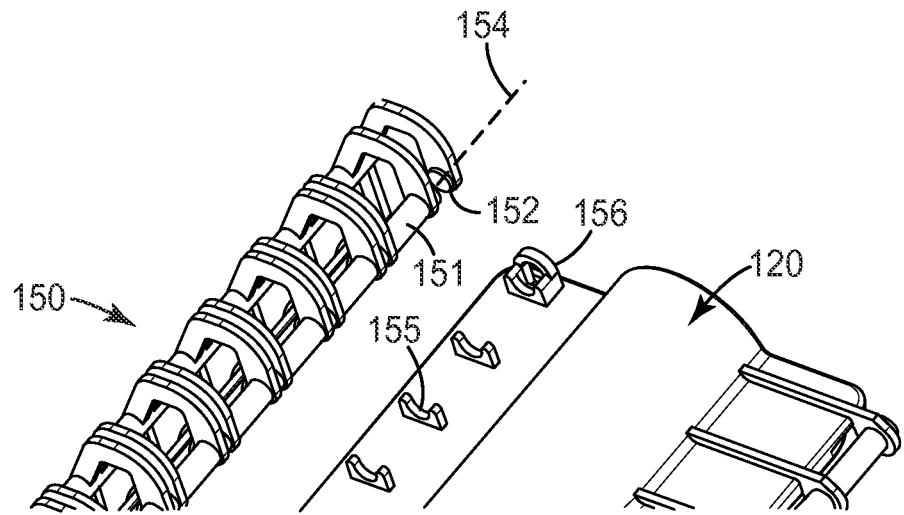
FIGS. 4A-4C are several detail views of the enclosure of FIG. 2.
Figure 4B:
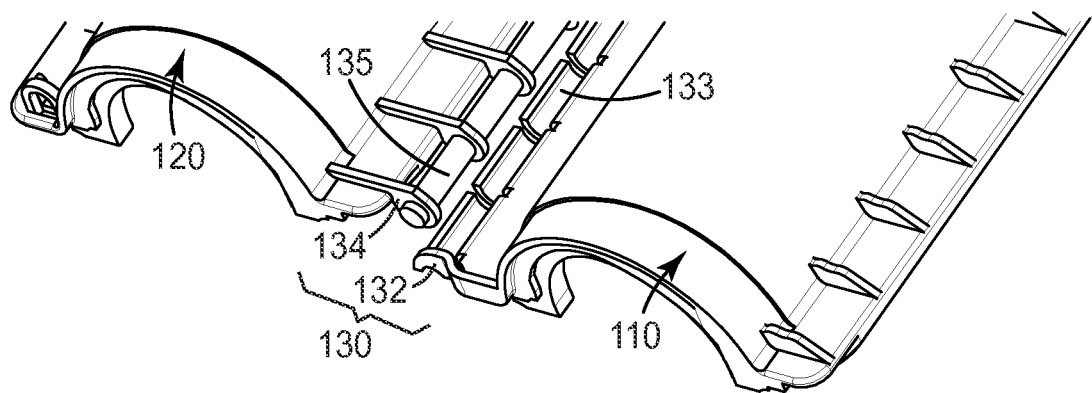
Figure 4C:
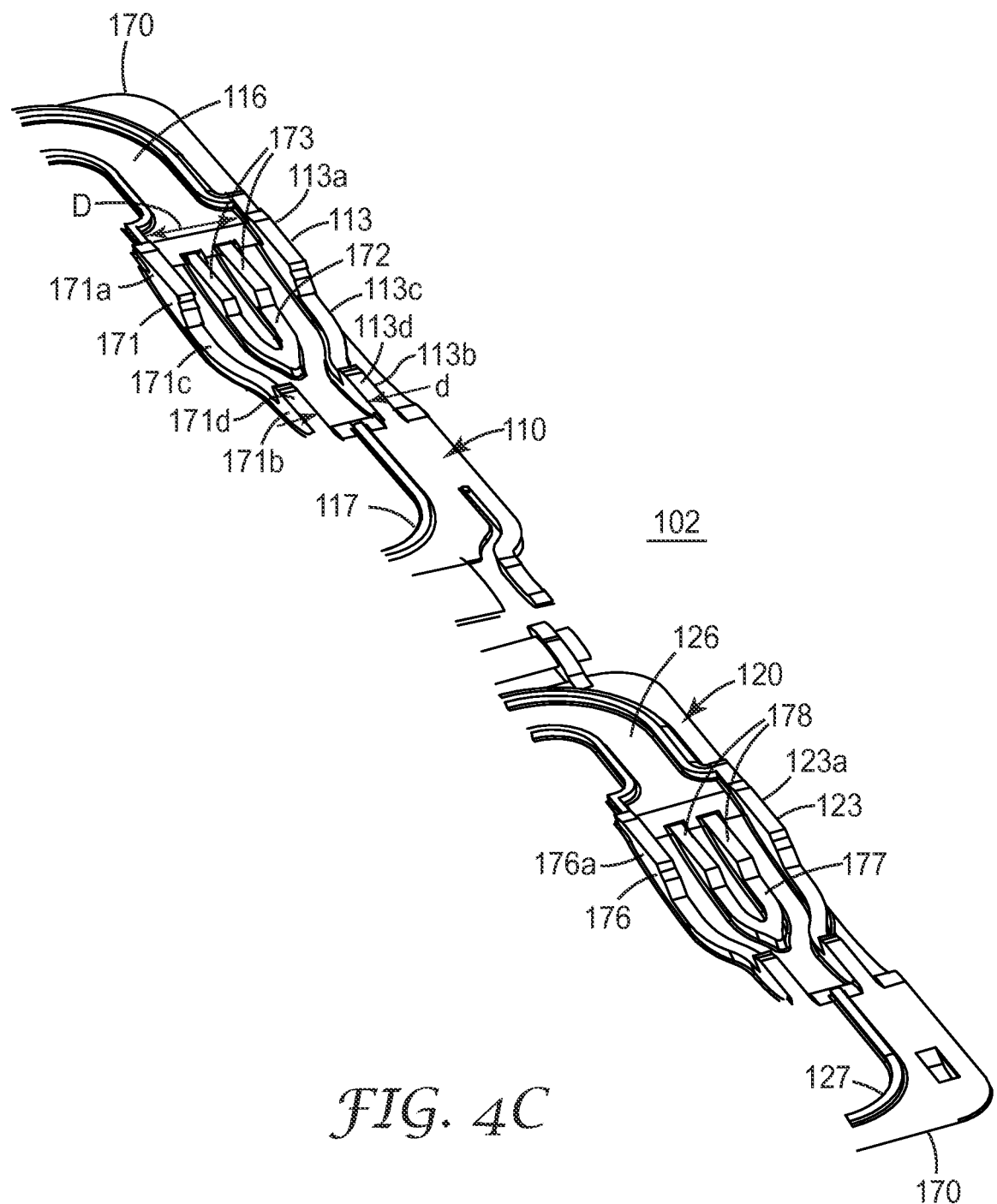

FIGS. 1B, 3 and 4A show an exemplary latch 150 pivotally attached to base 120. Latch 150 includes generally cylindrical hinge portions 151 that engage mating grooves 155 between retaining loop 156 disposed on each end of the second longitudinal side edge 122 of base 120. Latch 150 includes a hinge pin 152 disposed on the ends of the latch. The hinge pins 152 engage with retaining loops 156 on the base to enables the rotation of the latch around a pivot axis 154 centered on the hinge pins of the latch.

Figure 6A:
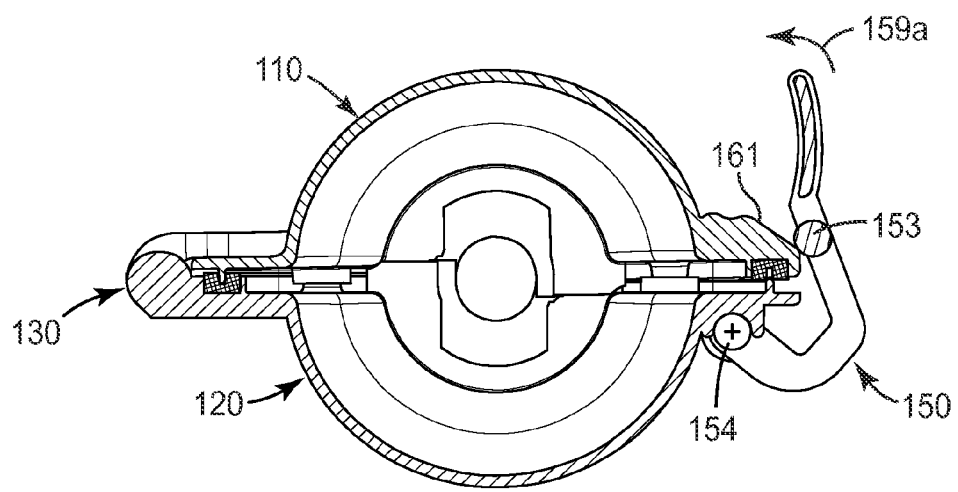
FIGS. 6A-6C are three cross-sectional views showing the latching of an exemplary enclosure according to an embodiment of the present invention.
Figure 6B:
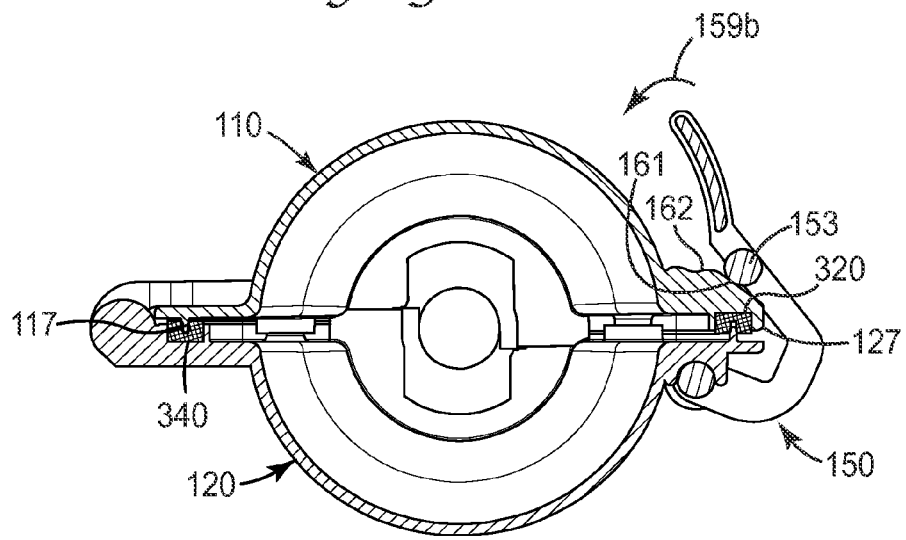
Figure 6C:
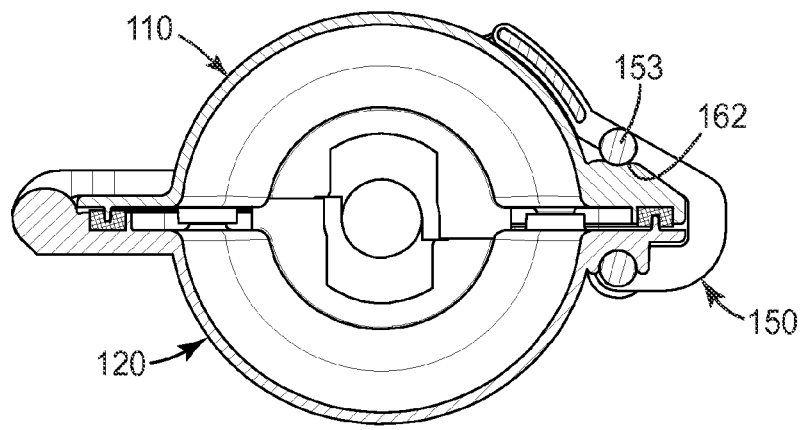

Referring now to FIGS. 6A-6C, operation of one embodiment of latch 150 is described in greater detail. In FIG. 6A, latch 150 has been installed on base 120 as described above, and base and cover 120, 110 have been moved toward the closed position. In particular, base and cover 120, 110 have been rotated about the hinge's pivot axis until the cover rests lightly on the base. Latch 150 is rotated about the pivot axis 154 in the direction of arrow 159a, until boss 153 of latch 150 engages ramped surface 161 of cover 110. As a latching force is applied by the installer and latch 150 is further rotated in the direction of arrow 159a, the interaction of boss 153 and ramped surface 161 causes further compression of sealing blades 117, 127 into sealing members 320, 340 (FIG. 6B). When continued application of the latching force in the direction of arrow 159b and rotation of latch 150 carries boss 153 past ridge 162 in ramped surface 161 of cover 110, the shapes of boss 153 and ridge 162 cooperate to prevent inadvertent disengagement from each other (FIG. 6C). Boss 153 and ridge 162 thereby provide a primary latch retention means.

In one embodiment, boss 153, ramped surface 161, and ridge 162 are configured such that when latch 150 transitions from the intermediate position illustrated in FIG. 6B to the final latched position in FIG. 6C, the installer is provided a tactile signal that latch 150 is fully engaged (e.g., a noticeable reduction in the application force, or an audible click). As can be seen in FIGS. 6A-6C, the compression force exerted by latch 150 is directed along a substantial portion of the longitudinal edge of the enclosure. In one embodiment the a plurality of discrete bosses are positioned along the length of latch 150 providing several contact points along the length of the enclosure to ensure a sufficient closing force to ensure the protective seal of enclosure 100. In an alternative aspect, the shapes of ramped surface 161, ridge 162 and continuous boss 153 are configured to provide a substantially continuous compression force on the sealing to ensure the protective seal of enclosure 100.

It will be appreciated that the form, location and number of the latches 150 that are used to hold the base and cover 120, 110 together in the closed position may be altered from that shown in the figures without departing from the scope and spirit of the invention. For example, the single latch 150 in the illustrated embodiment could be separated into two or more separate latches spaced along the length of splice enclosure 100.

Figure 7A:
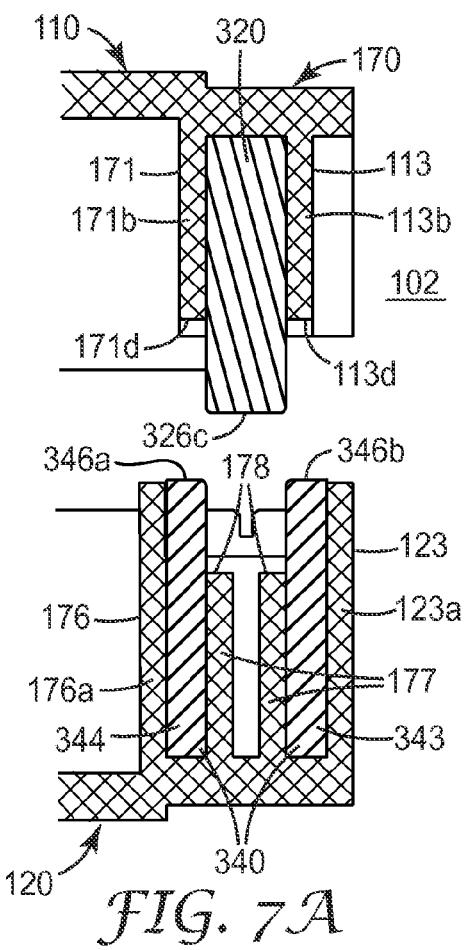
FIGS. 7A-7C are three cross-sectional schematic views showing the compression of the sealing gasket structures during latching of an exemplary enclosure according to an embodiment of the present invention.
Figure 7B:
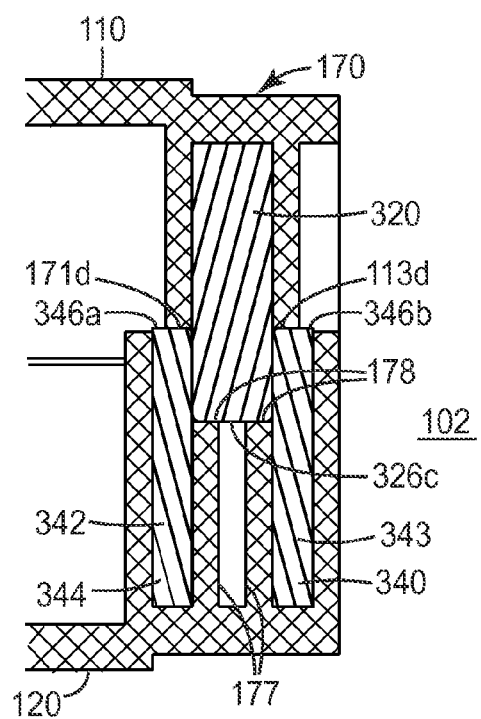
Figure 7C:
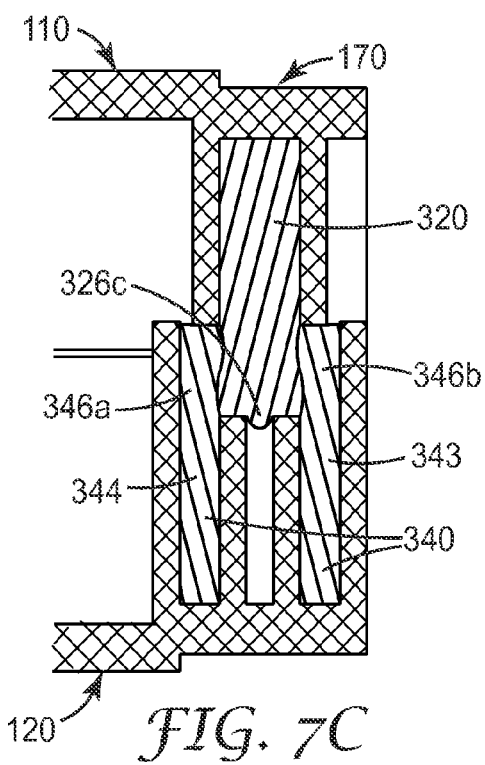

FIGS. 7A-7C illustrate the interactions that take place between the stops 113d, 171d, 178 in an end region of enclosure 100 and the sealing members 320,340. The stops are disposed near the ends of the base 120 and cover 110 and the interlocking features or protrusions 326, 346 on the first and second sealing members 320, 340. Specifically, FIGS. 7A-7C show cross-sectional views of the first end region 170 as the enclosure is closed and latched.

FIG. 7A shows a cross section of the first end region 170 having the first and second sealing members 320, 340 disposed therein when the enclosure is in an open position. The first end portion 322 of the first sealing member 320 is disposed between the first inner wall 171 and the first outer wall 113 of the cover 110, specifically the second sections 171b, 113b of the inner and outer walls, respectively. The figure further shows, the third end portion of the second sealing member 340 is disposed between the first inner wall 176 and the first outer wall 123 of the base 120, specifically the first sections 176a, 123a of the inner and outer walls, respectively.

As the enclosure is closed, protrusion 346c on the first sealing member 320 is inserted into the gap between the lobes 343, 344 of the second sealing member 340. The stops 178 on the central partition 177 in base 120 will contact interlocking feature 326c on the first sealing member and the stop 171 d on first inner wall 171 of the cover contacts interlocking feature 346a on the second lobe of the first end portion of the first sealing member and stop 113d on first outer wall 113 of the cover contacts interlocking feature 346b on the first lobe of the first end portion of the first sealing member as shown in FIG. 7B.

When the latch is fully engaged as shown in FIG. 6C, the first and second sealing members 620, 640 are compressed by the tops of the opposing end walls causing localized bulging in the sealing members in the vicinity of the contact points between the stops and the interlocking features on the sealing members. In addition, sealing tongue 638 forms a bulb-like shape as it is pushed into the receiving well as shown in FIG. 10C. Because the sealing members are made of a substantially incompressible material, the compression of the sealing members causes them to bulge out in the lateral direction. This lateral bulging action ensures that the first and second sealing members make intimate contact providing an enhanced seal for the enclosure.

FIGS. 8A and 8B show an alternative embodiment of an enclosure 200 for protecting a cable splice in an assembled and partially exploded condition, respectively. Splice enclosure 200 includes a cover 210 and a base 220 having a first end 202 and a second end 204. The cover and the base 210, 220 are configured for engagement with each other and used, in a manner similar to that described above, to form a protective re-enterable enclosure for cable splice. In the illustrated implementation, base and cover 220, 210 form a longitudinal or elongated enclosure having a generally cylindrical shape.

The base 220 and cover 210 are separately formed members and are movably joined to each other at a hinge 230 and secured in a closed position by latch 250. To form hinge 230, base and cover 220, 210 include hinge portions 234, 232 disposed on a longitudinal side edge of the base and the cover. Hinge portions 134, 132 of the base and the cover are configured for rotatable engagement with each other, and thereby rotatably join the base and the cover. Alternatively, the base and the cover can be integrally molded with each other and joined at a region of reduced thickness that defines a "living" hinge.

Base 220 and cover 210 each have a cavity portion 215, 225 respectively. When base and cover are folded together about hinge 230 from an open position (FIG. 8A) and are brought into engagement with each other to close the splice enclosure 100, cavity portions 215, 225 together form a central cavity (FIG. 8B) for containing the cable connection that is to be protected.

In one embodiment, the cables forming the splice enter central cavity from the first and second ends 202, 204 of enclosure 200. Two cables can enter enclosure 200 through cable entries, such as cable entry 206, in the end walls of the cover 210 and the base 220.

Enclosure 200 further includes a sealing system to ensure a protective seal along the open edges of the enclosure between the cover 210 and the base 220 and between the outer end walls of the enclosure and the cables passing therethrough. The sealing system includes two sealing members 240, 245 disposed in the cover and the base respectively. Each sealing member can be disposed in a sealing groove (not shown) that runs around a portion of the perimeter of the cover and the base. In order to ensure a tight sealing fit of the sealing system around the cylindrical body of the cable, the first and second sealing members include interlocking or overlapping features as described previously. The interlocking features intermate to for a reliable seal for enclosure 200 when it is secured in a closed state.

Figure 9A:
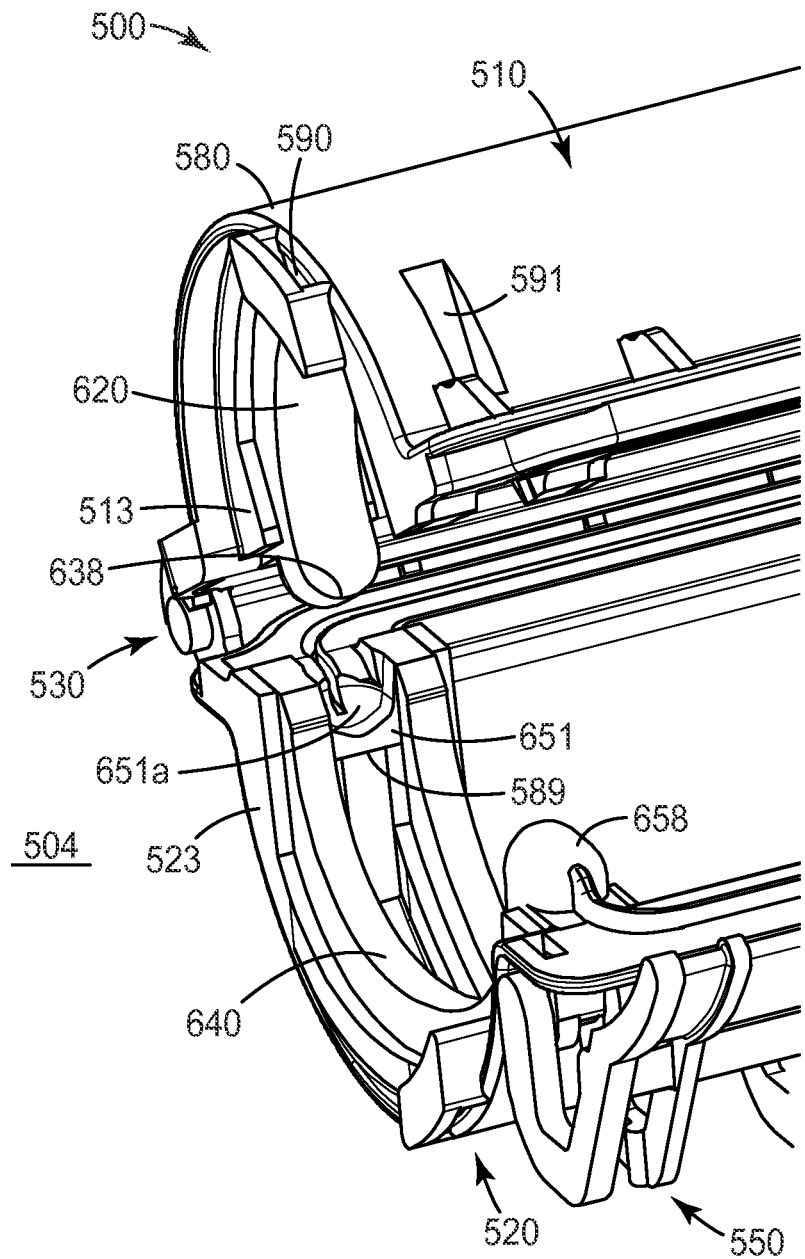
FIG. 9A shows a portion of another exemplary enclosure according to an embodiment of the present invention.

FIG. 9A shows a close-up of the second end 504 of exemplary enclosure 500. Enclosure 500 includes a cover 510 and a base 520 joined to each other at a hinge 530 and secured in a closed position by latch 550 similar to enclosure 100 of FIG. 1 and described previously. Base and cover 520, 510 each have an internal cavity portion that forms the enclosures central cavity for holding the cable connection that is to be protected by the enclosure when the cover and base are brought together.

Enclosure 500 further includes a sealing system to ensure a protective seal along the open edges of the enclosure between the cover and the base and between the outer end walls of the enclosure and the cables passing therethrough. The sealing system, shown in FIGS. 9A and 9C, includes two hermaphroditic sealing members 620, 640 disposed in the cover 510 and the base 520 respectively. The hermaphroditic sealing members have the same general shape and are configured to intermate when the enclosure is in a closed and secured state.

Figure 9B:
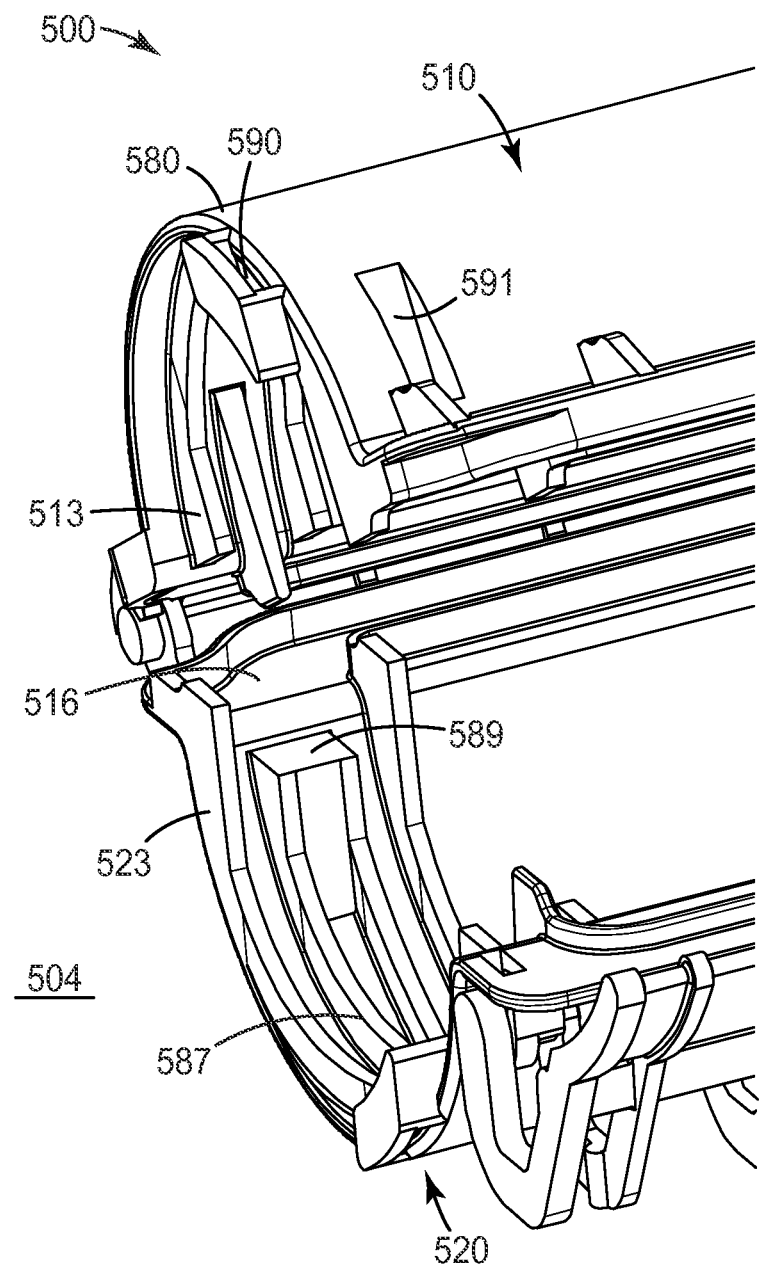
FIG. 9B shows a portion of the exemplary enclosure of FIG. 9A without the sealing members installed therein.

Each sealing member 620, 640 can be positioned in sealing grooves, such as sealing groove 516 shown in FIG. 9B. The sealing grooves can be disposed around a portion of the perimeter of the cover and the base. In order to ensure a tight sealing fit of the sealing system around the cylindrical body of the cable, the first and second sealing members include interlocking or overlapping features which will be described in more detail below.

Figure 9C:
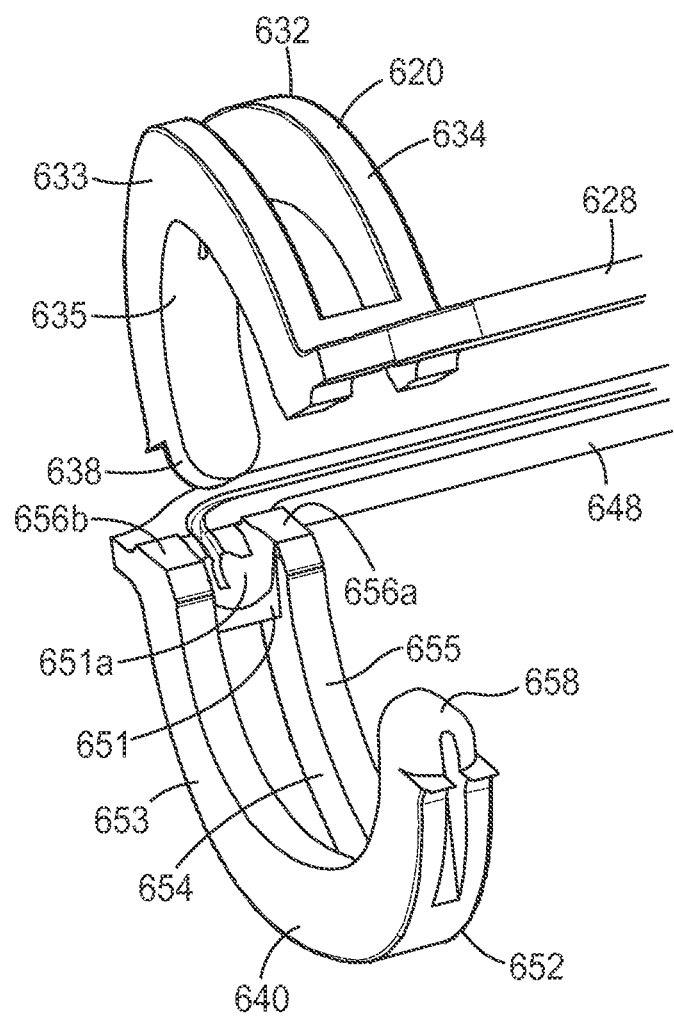
FIG. 9C shows a portion of the sealing members of the exemplary enclosure of FIG. 9A.

Sealing members 620, 640 of Fig. 9C are similar to sealing members 320, 340 shown in FIG. 3 and sealing members 420, 440 shown in FIG. 5C. Each sealing member 620, 640 has two end portions (end portions 632, 652 are shown in Fig. 9C) coupled by longitudinal member 628, 648. The end portions of sealing members 620, 640 can be disposed between the inner and outer walls of enclosure 500, as described in more detail below. The longitudinal members 628, 648 are placed in the sealing grooves which are disposed substantially parallel to the longitudinal edges of the cover and the base of enclosure 500. Each end portion 632, 652 has a curved surface 635, 655 sized to seal against the cables to be joined within enclosure 500. In addition, it may be advantageous to chamfer the leading edge of the lobed portions leading into the curved surface of the end portions. This chamfering of the leading edges can facilitate guiding of the cables into the proper position within the end portions of the sealing members.

The first and second sealing members 620, 640 have interlocking or overlapping features when joined together to ensure a tight sealing fit of the sealing system around the cylindrical body of the cable passing into the enclosure. Referring to FIGS. 9A and 9C, end portion 652 can have a plurality of protrusions 656a, 656b extending from the lobes 654, 653 of the second end portion adjacent to the longitudinal member 648 which are configured to extend beyond the theoretical center plane of the cable when the enclosure is closed and latched to improve the sealing capability of the sealing system. In addition, the end portions 632, 652 have a sealing tongue 638, 658 at the point of the end portion where the two lobes are connected. The sealing tongues are configured to mate with a receiving well or depression (e.g. receiving well 651a) in a sealing bridge (e.g. sealing bridge 651 shown in FIG. 9C) to provide a reliable seal.

FIG. 9B illustrates an enlarged view of the second end region 580 of enclosure 500 in a partially open state to show the sealing member retaining features on the cover and the base of the enclosure. The second end region is bounded by outer end walls 513,523 and inner end walls (not shown) in the cover 510 and base 520, respectively. The inner and outer end walls have a first section which can be oriented substantially perpendicular to the longitudinal edges of the enclosure and a second section which can also be oriented substantially perpendicular to the longitudinal edges of the enclosure but which are disposed closer together that the firs sections. The first and second sections of the outer wall are connected by a transition section.

The end region can additionally have a central partition (e.g. central partition 587 disposed in base 520 in FIG. 9B) disposed between the end walls configured to support the inner surfaces of the lobes of the sealing member end portions. In an exemplary, aspect the central partition can have a wishbone shape which is configured for use with sealing members shown in FIG. 9C. Referring to FIGS. 9A-9C, the central partition can have a support shelf disposed across the wide portion of the wishbone shaped inner partitions to support a sealing bridge of sealing material such as support shelf 589 disposed within base 520 which supports sealing bridge 651 between the lobes 653, 654 of the sealing member 640. The sealing bridge of sealing member 640 includes a receiving well or depression 651a which is configured to receive sealing tongue 638 of sealing member 620 when the cover is closed over the base. Sealing members 620, 640 will have complementary receiving well and sealing tongues at corresponding positions although they are not shown in the figures.

FIGS. 10A-10C show the compression of the sealing members 620, 620 of an exemplary enclosure such as is shown in FIGS. 9A-9B during latching.

FIG. 10A shows a cross section of the second end region 580 having the first and second sealing members 620, 640 disposed therein when the enclosure is in an open position. End portion 632 (FIG. 9C) of the first sealing member 620 is disposed between the first inner wall 581 and the first outer wall 513 of the cover 510. The figure further shows, end portion 652 (FIG. 9C) of the second sealing member 640 is disposed between the first inner wall 586 and the first outer wall 523 of the base 520. The tops of the inner and outer walls of the base and cover act as stops when the cover is closed over the base when the enclosure is sealed.

As the enclosure is closed, sealing tongue 638 on the first sealing member 620 is inserted into the gap between the lobes 656a, 656b of the second sealing member 640 and into receiving well 651a in sealing bridge 651 as shown in FIG. 9C.

When the latch is fully engaged as shown in FIG. 6C, the first and second sealing members 620, 640 are compressed by the tops of the opposing end walls causing localized bulging in the sealing members in the vicinity of the contact points between the stops and the interlocking features on the sealing members. In addition, sealing tongue 338 forms a bulb-like shape as it is pushed into the receiving well. Because the sealing members are made of a substantially incompressible material, the compression of the sealing members causes them to bulge out in the lateral direction. This lateral bulging action ensures that the first and second sealing members make intimate contact providing an enhanced seal for the enclosure.

Referring back to FIGS. 9A and 9B, enclosure 500 can include one of more tool insertion loops 590 or openings 591 to facilitate opening of the enclosure after the latch 550 has been released. A tool such as a screw driver can be inserted into either the tool insertion loop 590 or opening 591 to apply a lever force to one of the cover or the base of the enclosure to open the enclosure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An enclosure for a cable connection, the enclosure comprising:
    a cover;
    a base configured for engagement with the cover, wherein the cover and the base form a cavity for enclosing the cable splice when the base and cover are in a closed position;
    a first sealing member disposed in one of the base and the cover; the first sealing member comprising first and second end portions coupled by a longitudinal member, wherein each end portion includes at least two lobes separated by a gap;
    at least one second sealing member disposed in one of the cover and the base, the at least one second sealing member comprising a third end portion having a protrusion, wherein the protrusion on the third end portion is configured for insertion into the gap between the lobes of one of the first and second end portions of the first sealing member to form an intermating seal; and
    a plurality of stops disposed at each end of the base and the cover, the stops configured to engage with portions of the first and second sealing members to enhance compression of the sealing members in the intermating seal.

2. The enclosure of claim 1, further comprising a hinge rotatably joining first longitudinal edges of the base and the cover.

3. The enclosure of claim 1, further comprising at least one latch disposed along a second longitudinal edge of one of the base and the cover, wherein the latch is configured to maintain the enclosure in the closed position.

4. The enclosure of claim 3, wherein the latch exerts a compression force between the second longitudinal edges of the base and the cover along a substantial length of the enclosure.

5. The enclosure of claim 1, wherein the first and second sealing members are hermaphroditic and configured to intermate when the base and cover are in a closed position.

6. The enclosure of claim 1, further comprising a third sealing member disposed in one of the cover and the base, the third sealing member comprising a forth end portion having a protrusion, wherein the protrusion on the forth end portion is configured for insertion into the gap between the lobes of one of the first and second end portions of the first sealing member to form an intermating seal.

7. The enclosure of claim 1, wherein the enclosure has a fluted shape.

8. The enclosure of claim 1, further comprising a sealing bridge disposed in the gap between the lobes of one of the first and second end portions of the first sealing member.

* * * * *